United States Patent
Nagano et al.

(10) Patent No.: US 7,376,162 B2
(45) Date of Patent: May 20, 2008

(54) METHOD FOR STABILIZING OPTICAL OUTPUT OF SEMICONDUCTOR LASER

(75) Inventors: Kazuhiko Nagano, Kaisei-machi (JP); Yoji Okazaki, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 306 days.

(21) Appl. No.: 10/671,780

(22) Filed: Sep. 29, 2003

(65) Prior Publication Data
US 2004/0066812 A1  Apr. 8, 2004

(30) Foreign Application Priority Data
Sep. 30, 2002 (JP) ............... 2002-287633

(51) Int. Cl.
*H01S 3/04* (2006.01)
(52) U.S. Cl. .......................... 372/34; 372/36
(58) Field of Classification Search .............. 372/29.02
See application file for complete search history.

(56) References Cited

U.S. PATENT DOCUMENTS 4,730,112 A * 3/1988 Wong .................... 250/343
5,463,648 A * 10/1995 Gibbs .................... 372/38.02
6,185,232 B1 * 2/2001 Hess et al. .................... 372/28
2003/0081192 A1 * 5/2003 Nishi ......................... 355/69

FOREIGN PATENT DOCUMENTS

| JP | 61265886 A | 11/1986 |
|----|------------|---------|
| JP | 11-284284 A | 10/1999 |
| JP | 2001102671 A | 4/2001 |

* cited by examiner

*Primary Examiner*—Dung (Michael) T. Nguyen
(74) *Attorney, Agent, or Firm*—Sughrue Mion, PLLC

(57) ABSTRACT

In a method for stabilizing an optical output of a semiconductor laser: the semiconductor laser is heated with a heater when the semiconductor laser is not in operation; and the heating of the semiconductor laser is stopped, or the amount of heat supplied to the semiconductor laser is lowered, almost simultaneously with startup of the semiconductor laser.

18 Claims, 7 Drawing Sheets

METHOD FOR STABILIZING OPTICAL OUTPUT OF SEMICONDUCTOR LASER

BACKGROUND OF THE INVENTION

1. Field of the Invention

The present invention relates to a method for stabilizing the optical output of a semiconductor laser (laser diode).

2. Description of the Related Art

Conventionally, semiconductor lasers are used in various fields. Since the semiconductor lasers are more responsive than gas lasers and the like, for example, the semiconductor lasers are often used as light sources in image exposure apparatuses and the like. In such cases, sometimes the semiconductor lasers are intermittently driven. For example, a semiconductor laser is driven for 15 seconds for image exposure, and stopped for 10 seconds for replacement of an exposed photosensitive material with a new photosensitive material.

When a semiconductor laser is driven as above, it is desired that the output power of the semiconductor laser reaches a predetermined level immediately after start of driving (for example, within one second), and thereafter the predetermined level is maintained.

In a conventionally known method for stabilizing the optical output of a semiconductor laser, variations of a laser-light output corresponding to a control signal for a laser light source is measured in advance, the variation pattern is recorded, and the control signal is corrected according to the variation pattern, as disclosed in, for example, Japanese Unexamined Patent Publication No. 11 (1999)-284284.

However, in the above method disclosed in Japanese Unexamined Patent Publication No. 11 (1999)-284284, it is very difficult to stabilize the optical output immediately after (within about one second of) startup of the semiconductor laser. Further, although GaN-based compound semiconductor lasers which oscillate in the blue wavelength range are known, it is particularly difficult to stabilize the optical outputs of this type of GaN-based compound semiconductor laser immediately after their startup.

SUMMARY OF THE INVENTION

The present invention has been developed in view of the above circumstances. It is an object of the present invention to provide a method for stabilizing the optical output of a semiconductor laser immediately after startup of the semiconductor laser.

According to the present invention, there is provided method for stabilizing an optical output of a semiconductor laser, comprising the steps of: (a) heating the semiconductor laser with a heater when the semiconductor laser is not in operation; and (b) performing one of a first operation of stopping heating of the semiconductor laser and a second operation of decreasing an amount of heat supplied to the semiconductor laser, almost simultaneously with startup of the semiconductor laser.

According to research by the present inventor, the reason for the difficulty in stabilizing the optical output of a semiconductor laser immediately after startup is that the temperature of the semiconductor laser rises due to heat generated by the semiconductor laser when the semiconductor laser is started up, and the optical output of the semiconductor laser becomes unstable due to the temperature rise after the startup.

Based on the above knowledge, in the method for stabilizing the optical output of a semiconductor laser according to the present invention, the semiconductor laser is heated with the heater when the semiconductor laser is not in operation. Thereafter, the heating of the semiconductor laser is stopped, or the amount of heat supplied to the semiconductor laser is decreased, almost simultaneously with startup of the semiconductor laser. Therefore, it is possible to reduce the difference between the temperatures before and after the startup of the semiconductor laser, and suppress the temperature rise after the startup. Thus, variations in the optical output of the semiconductor laser can be suppressed, and the optical output of the semiconductor laser can be stabilized from the time immediately after the startup.

In order to obtain the above-mentioned advantages, it is preferable that the heating by the heater is stopped almost simultaneously with startup of the semiconductor laser.

Preferably, the method according to the present invention may also have one or any possible combination of the following additional features (i) to (v).

(i) The heater heats the vicinity of the semiconductor laser at a heating rate which approximately corresponds to a heat-generation rate per unit time at which the semiconductor laser generates heat when the semiconductor laser is in operation, and the first operation is performed almost simultaneously with startup of the semiconductor laser. In this case, it is possible to maintain the temperature of the semiconductor laser almost unchanged even when the semiconductor laser is started up. Therefore, a particularly satisfactory effect of stabilizing the optical output can be obtained.

(ii) A current lower than an oscillation threshold level of the semiconductor laser is supplied to the semiconductor laser when the semiconductor laser is not in operation (i.e., the semiconductor laser is not driven to oscillate with a desired optical output). In this case, it is possible to limit the difference between the temperatures before and after the startup to a smaller amount. Therefore, it becomes easier to maintain the temperature of the semiconductor laser almost unchanged even when the semiconductor laser is started up. Thus, a particularly satisfactory effect of stabilizing the optical output can be obtained.

(iii) The semiconductor laser is realized by a GaN-based compound semiconductor laser, a multicavity semiconductor laser having a plurality of light-emission points, or a plurality of semiconductor lasers mounted on a common block.

The reason why stabilization of optical outputs of GaN-based compound semiconductor lasers immediately after startup is particularly difficult as mentioned before is that the electricity-to-light conversion efficiency in the GaN-based compound semiconductor lasers (about 10 to 20%) is lower than that in semiconductor lasers which oscillate in longer wavelength ranges such as the infrared wavelength range. Therefore, the difference between the temperatures before and after startup is likely to become great. When the method for stabilizing the optical output of a semiconductor laser according to the present invention is used in driving a GaN-based compound semiconductor laser, it is possible to surely stabilize the optical output of the GaN-based compound semiconductor laser, which is conventionally difficult to stabilize immediately after startup. Thus, it is particularly effective to use the method according to the present invention in GaN-based compound semiconductor lasers.

When the semiconductor laser is realized by a multicavity semiconductor laser having a plurality of light-emission points or a plurality of semiconductor lasers mounted on a common block, the amount of heat generated during operation is great. Therefore, the difference between the temperatures before and after startup is likely to become great. When the method for stabilizing the optical output of a semiconductor laser according to the present invention is used in driving a multicavity semiconductor laser or a plurality of semiconductor lasers mounted on a common block, it is possible to surely stabilize the optical output of the multicavity semiconductor laser or the plurality of semiconductor lasers, which is conventionally difficult to stabilize immediately after startup. Thus, it is particularly effective to use the method according to the present invention in a multicavity semiconductor laser having a plurality of light-emission points or a plurality of semiconductor lasers mounted on a common block.

(iv) The heater comprises a heating wire or a heating resistor.

(v) The heater is realized by a semiconductor laser chip. When a heating wire or a heating resistor is used in the heater, a delay in response can occur due to self-inductance of the heater, and the delay in response can raise the temperature of the semiconductor laser immediately after startup above a target value. On the other hand, in semiconductor laser chips, the current response (i.e., temperature response) to a driving command signal is fast. Therefore, when a semiconductor laser chip is used as the heater, it is possible to avoid the above problem caused by the delay in response.

Conventionally, for example, when a semiconductor laser is cyclically driven in such a manner that the semiconductor laser is driven for 15 seconds for exposure and stopped for 10 seconds, it is impossible to stop driving of the semiconductor laser, since the semiconductor laser is unstable after startup. On the other hand, according to the present invention, it is sufficient to start the driving of the semiconductor laser one second before the start of the exposure. That is, it is possible to stop the driving of the semiconductor laser for 9 seconds in each cycle of 25 seconds. Therefore, it is possible to increase the lifetime of the semiconductor laser by about 50%.

DESCRIPTION OF PREFERRED EMBODIMENTS

Embodiments of the present invention are explained in detail below with reference to the attached drawings.

Construction of First Embodiment

Figure 1:
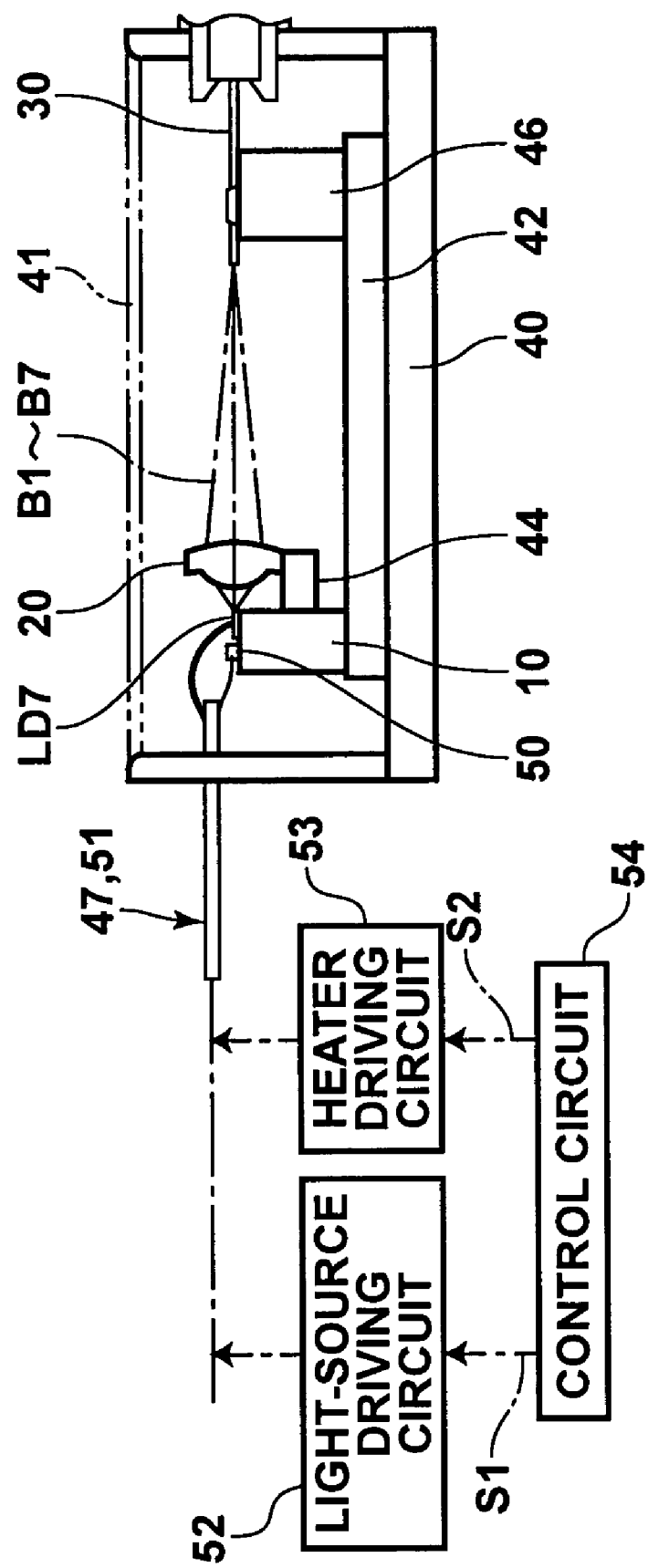
FIG. 1 is a side view of a high-luminance ultraviolet-light optically-multiplexing fiber module according to a first embodiment of the present invention.
Figure 2:
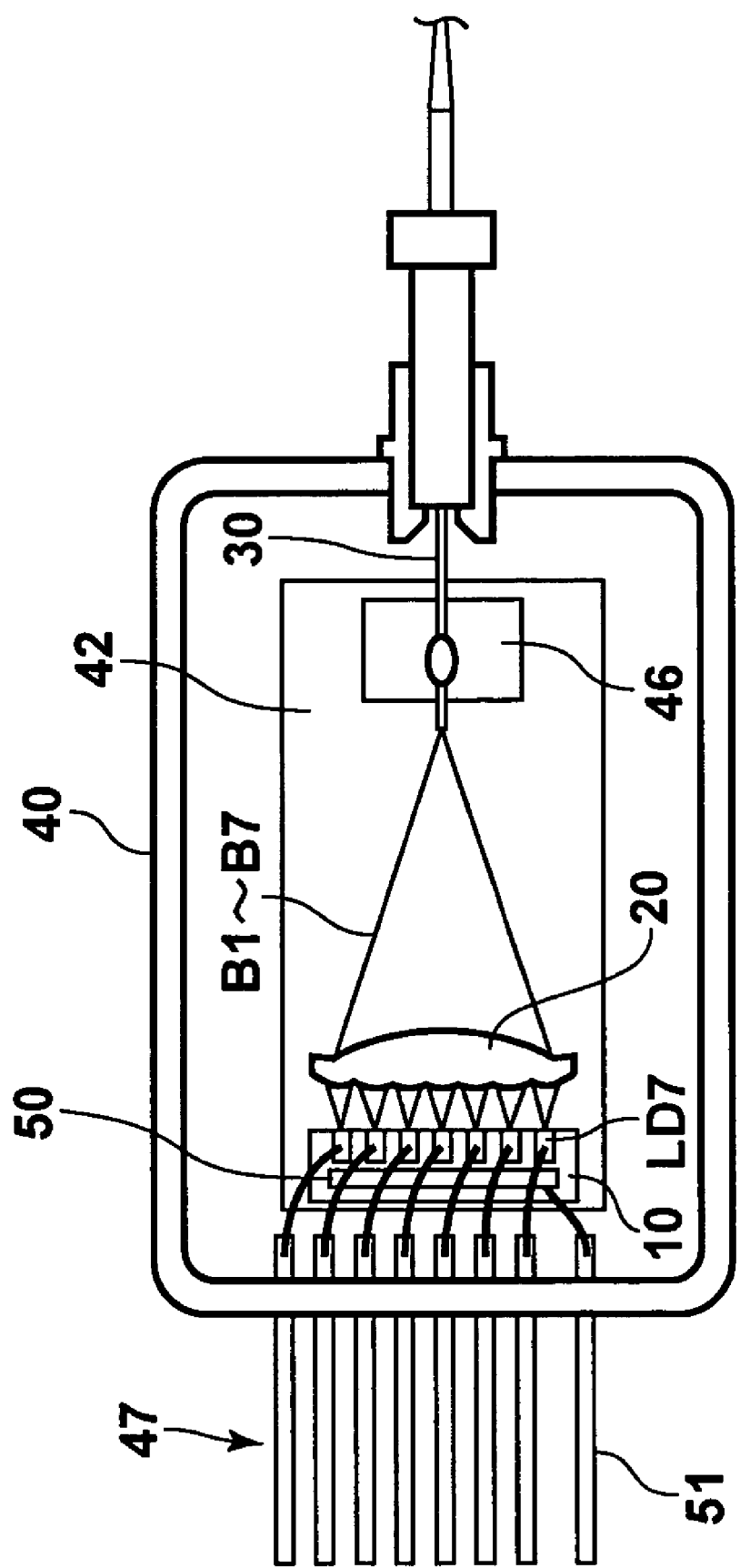
FIG. 2 is a plan view of the high-luminance ultraviolet-light optically-multiplexing fiber module of FIG. 1.
Figure 3:
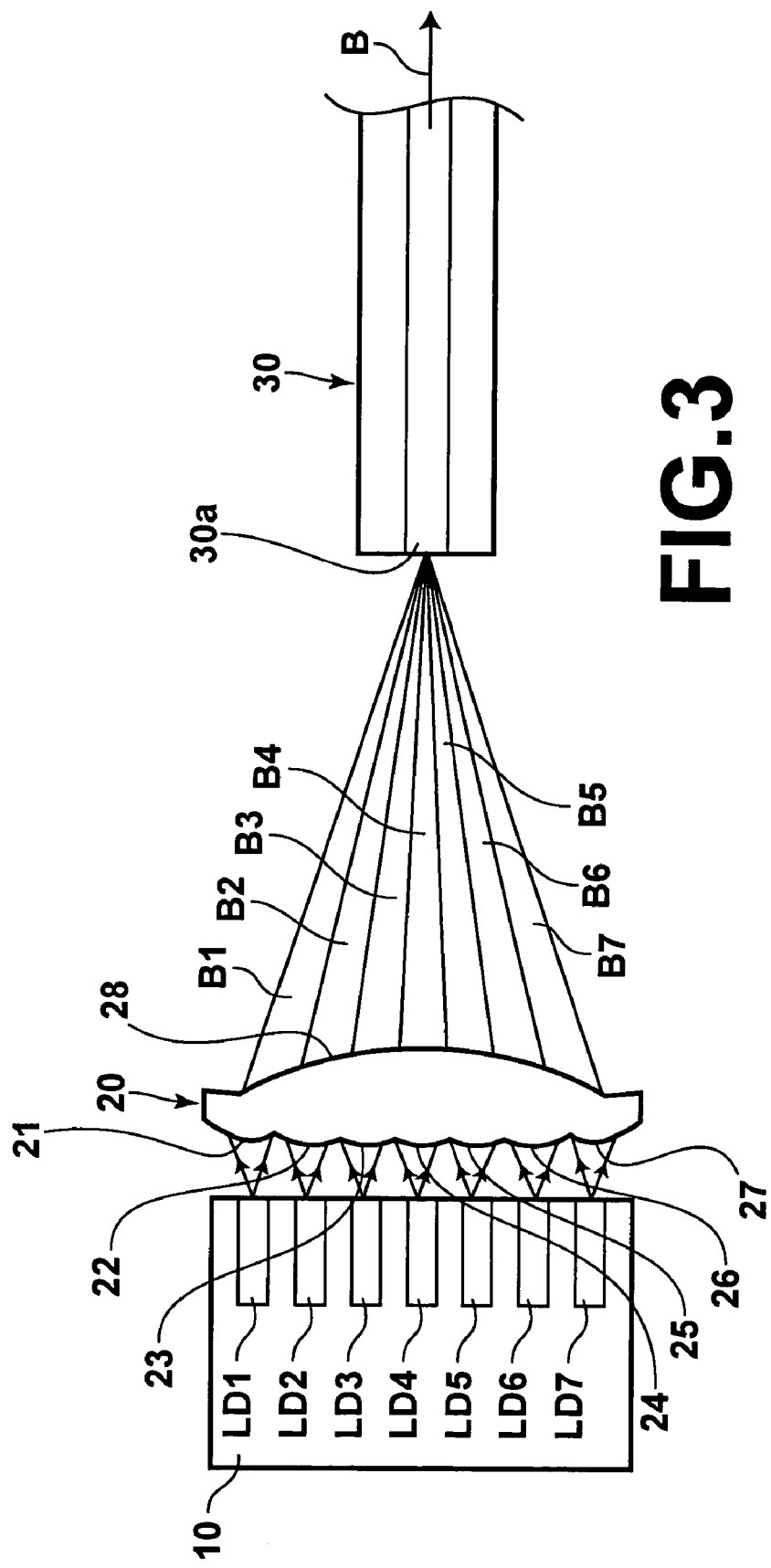
FIG. 3 is a plan view of an optically-multiplexing laser-light source constituting the high-luminance ultraviolet-light optically-multiplexing fiber module of FIGS. 1 and 2.

FIGS. 1 and 2 are side and plan views of a high-luminance ultraviolet-light optically-multiplexing fiber module according to the first embodiment of the present invention, and FIG. 3 is a plan view of an optically-multiplexing laser-light source constituting the high-luminance ultraviolet-light optically-multiplexing fiber module of FIGS. 1 and 2.

Figure 4:
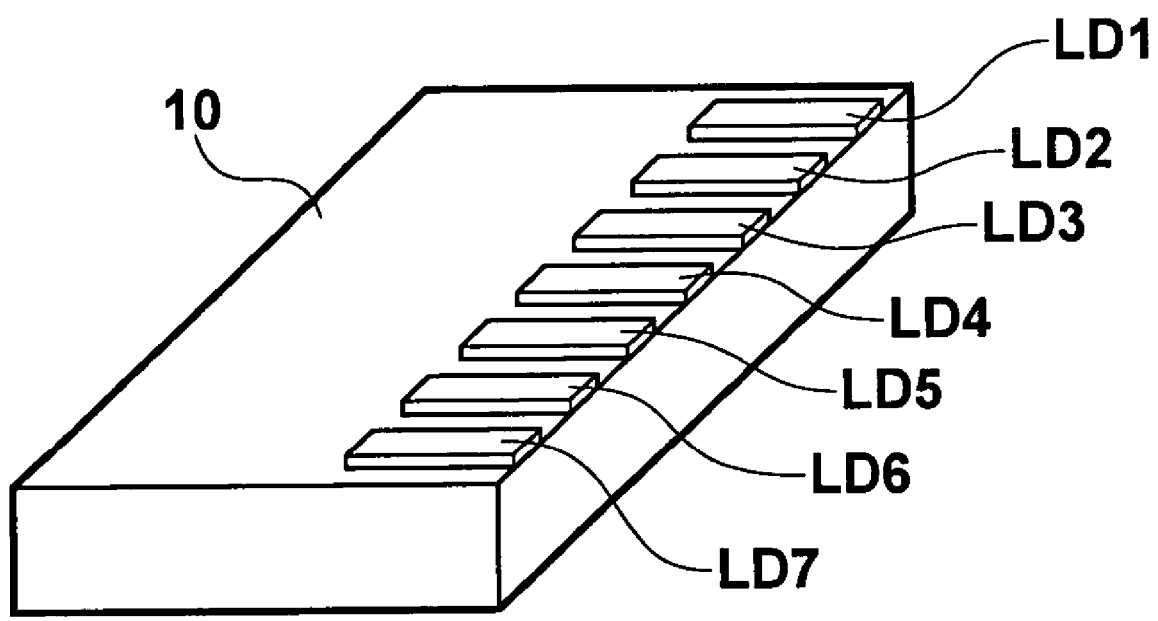
FIG. 4 is a perspective view of a portion of the optically-multiplexing laser-light source of FIG. 3 containing semiconductor lasers.
Figure 5A:
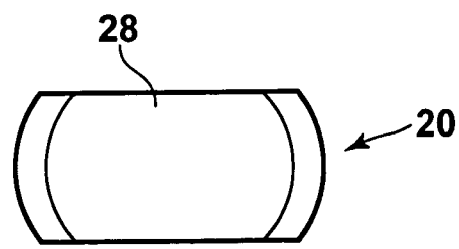
FIG. 5A is a front view of a condensing lens constituting the optically-multiplexing laser-light source of FIG. 3.
Figure 5B:
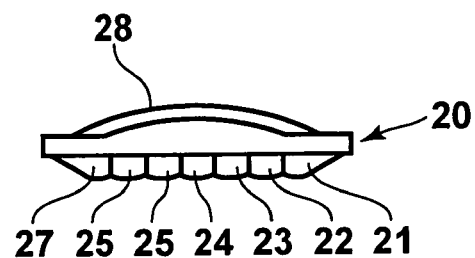
FIG. 5B is a bottom view of the condensing lens constituting the optically-multiplexing laser-light source of FIG. 3.
Figure 5C:
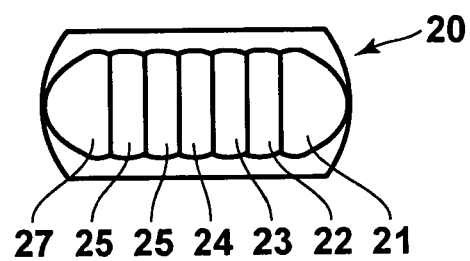
FIG. 5C is a back view of the condensing lens constituting the optically-multiplexing laser-light source of FIG. 3.
Figure 5D:
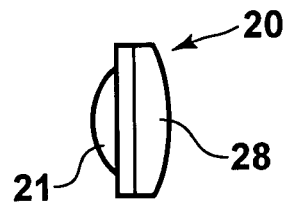
FIG. 5D is a side view of the condensing lens constituting the optically-multiplexing laser-light source of FIG. 3.

First, the optically-multiplexing laser-light source is explained below with reference to FIG. 3. As illustrated in FIG. 3, the optically-multiplexing laser-light source of FIG. 3 comprises GaN-based semiconductor laser chips LD1 through LD7, a condensing lens 20, and a multimode optical fiber 30. Each of the GaN-based semiconductor laser chips LD1 through LD7 operates in multiple transverse modes. The GaN-based semiconductor laser chips LD1 through LD7 are fixedly arranged on a heat block 10 made of copper as illustrated in FIG. 4.

FIGS. 5A through 5D are front, bottom, back, and side views of the condensing lens 20, respectively. Seven collimator-lens portions 21 through 27 and a condensing-lens portion 28 in the condensing lens 20 are integrally formed out of an identical material. For example, the condensing lens 20 can be formed by molding from resin or optical glass.

Each of the outermost ones 21 and 27 of the collimator-lens portions 21 through 27 has a shape obtained by cutting an axially symmetric lens along a plane being parallel to and not containing the optical axis of the axially symmetric lens so as to leave a portion of the axially symmetric lens containing the optical axis of the axially symmetric lens. Each of the other collimator-lens portions 22 through 26 has a shape obtained by cutting an axially symmetric lens along two parallel planes each being parallel to and not containing the optical axis of the axially symmetric lens so as to leave a portion of the axially symmetric lens being located between the two parallel planes and containing the optical axis of the axially symmetric lens, where the axially symmetric lenses used for obtaining the shapes of the collimator-lens portions 21 and 27 are identical. Each adjacent pair of the collimator-lens portions 21 through 27 abut each other so as to share a plane.

The condensing-lens portion 28 has a shape obtained by cutting an axially symmetric lens (which has a different shape from the axially symmetric lenses used for producing the collimator-lens portions 21 through 27) along two parallel planes each being parallel to and not containing the optical axis of the axially symmetric lens so as to leave a portion of the axially symmetric lens being located between the two parallel planes and containing the optical axis of the axially symmetric lens. The collimator-lens portions 21 through 27 are arranged along the lengthwise direction of the condensing-lens portion 28, and the optical axis of the collimator-lens portion 24 arranged in the center of the collimator-lens portions 21 through 27 coincides with the optical axis of the condensing-lens portion 28.

The GaN-based semiconductor laser chips LD1 through LD7 have an identical oscillation wavelength of 405 nm and an identical maximum output power of 100 mW. The light emitted from each of the GaN-based semiconductor laser chips LD1 through LD7 is an elliptic light beam having a spread angle (full width at half maximum) of 30 degrees in the major axis direction perpendicular to the plane of FIG. 3 and a spread angle (full width at half maximum) of 10 degrees in the minor axis direction parallel to the plane of FIG. 3. The GaN-based semiconductor laser chips LD1 through LD7 are arranged so that the light-emission points of the GaN-based semiconductor laser chips LD1 through LD7 are respectively located on the optical axes of the collimator-lens portions 21 through 27, and the major axis direction coincides with the direction in which each of the collimator-lens portions 22 through 26 is elongated. That is, the GaN-based semiconductor laser chips LD1 through LD7 are arranged so that the light-emission points are aligned on a line parallel to active layers of the GaN-based semiconductor laser chips LD1 through LD7.

The multimode optical fiber 30 is formed by using a graded-index type optical fiber manufactured by Mitsubishi Cable Industries, Ltd as its base. The multimode optical fiber 30 has a graded-index type core and a step-index type cladding, where the core diameter is 25 micrometers, the numerical aperture (NA) is 0.3, and the transmittance of the end face coating is 99.5% or greater.

Divergent laser beams B1 through B7 emitted from the GaN-based semiconductor laser chips LD1 through LD7 are respectively collimated by the collimator-lens portions 21 through 27. Then, the collimated laser beams B1 through B7 are collected by the condensing-lens portion 28, and converge on an entrance end face of the core 30a of the multimode optical fiber 30. In this example, an optical condensing system is realized by the condensing lens 20, and an optical system for optical multiplex is constituted by the optical condensing system and the multimode optical fiber 30. Thus, the laser beams B1 through B7 collected by the condensing lens 20 as above enter and propagate in the core 30a of the multimode optical fiber 30, in which the laser beams B1 through B7 are optically multiplexed into a single laser beam B. Then, the laser beam B is outputted from the multimode optical fiber 30. The multimode optical fiber 30 may be a step-index type, a graded-index type, or any combination thereof.

In the construction of the first embodiment, the coupling efficiency of the laser beams B1 through B7 to the multimode optical fiber 30 is 0.9. Therefore, when the output power of each of the GaN-based semiconductor laser chips LD1 through LD7 is 100 mW, the output power of the optically multiplexed laser beam B becomes 630 mW (=100 mW×0.9×7).

As explained above, the laser beams B2 through B6 respectively enter the collimator-lens portions 22 through 26 in such a manner that the direction in which the spread angle of each of the laser beams B2 through B6 is maximized coincides with the direction of the greater diameter of the elongated aperture of each of the collimator-lens portions 22 through 26, and the direction in which the spread angle of each of the laser beams B2 through B6 is minimized coincides with the direction of the smaller diameter of the elongated aperture of each of the collimator-lens portions 22 through 26. Since the elliptic cross sections of the incident laser beams B2 through B6 fit well with the elongated shapes of the collimator-lens portions 22 through 26, it is possible to minimize portions of the apertures of the collimator-lens portions 22 through 26 which are not effectively used. In other words, the collimator-lens portions 22 through 26 can be efficiently used. In addition, to some degree, a similar advantage occurs in the collimator-lens portions 21 and 27. Alternatively, the collimator-lens portions 21 and 27 may also have the same shape as the collimator-lens portions 22 through 26.

Next, the high-luminance ultraviolet-light optically-multiplexing fiber module constituted by the optically-multiplexing laser-light source of FIG. 3 is explained in detail with reference to FIGS. 1 and 2. In FIGS. 1 and 2, in order to simplify the illustration, the reference numbers of the GaN-based semiconductor laser chips LD1 through LD6 are not shown.

In this example, the optical elements constituting the high-luminance ultraviolet-light optically-multiplexing fiber module are contained in a box type package 40, which has an opening on the upper side, When the opening is closed with a cover 41, the high-luminance ultraviolet-light optically-multiplexing fiber module is hermetically sealed and held within the closed space realized by the package 40 and the cover 41.

A base plate 42 is fixed on the inner bottom surface of the package 40, the aforementioned heat block 10 is fixed on the upper surface of the base plate 42, and a lens holder 44 for holding the condensing lens 20 is fixed to the heat block 10. In addition, a fiber holder 46 for holding the entrance end portion of the multimode optical fiber 30 is also fixed to the upper surface of the base plate 42. Further, wirings 47 for supplying driving currents to the GaN-based semiconductor laser chips LD1 through LD7 are led out of the package 40 through openings formed in a sidewall of the package 40.

In addition, a heater 50 is fixed on the heat block 10 in the vicinities of each of the GaN-based semiconductor laser chips LD1 through LD7 in such a manner that the heater 50 extends along the GaN-based semiconductor laser chips LD1 through LD7. The heater 50 is realized by a heating wire, a heating resistor, or the like. The heater 50 generates heat when current flows through the heater 50. Wirings 51 for supplying currents to the heater 50 are also led out of the package 40 through an opening formed in a sidewall of the package 40.

The GaN-based semiconductor laser chips LD1 through LD7 are driven when a driving current is supplied from a light-source driving circuit 52 illustrated in FIG. 1, and the heater 50 is driven when a driving current is supplied from a heater driving circuit 53 illustrated in FIG. 1. The operations of the light-source driving circuit 52 and the heater driving circuit 53 are controlled in accordance with a light-source-driving command signal (LD-driving command signal) S1 and a heater-driving command signal S2, which are supplied from a control circuit 54 as voltage signals.

Operations of First Embodiment

Figure 6:
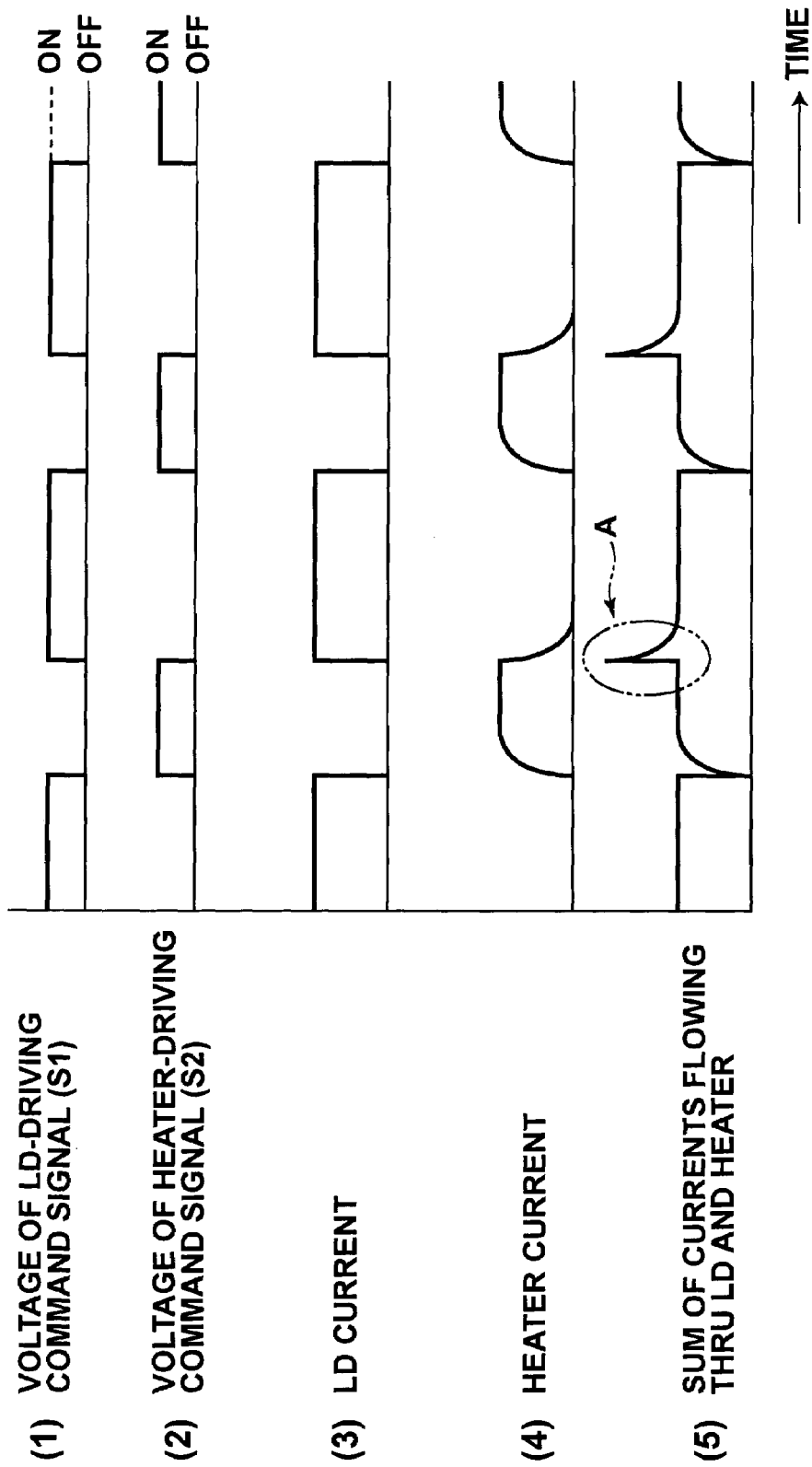
FIG. 6 is a graph indicating waveforms of driving signals and currents of semiconductor lasers and a heater in the first embodiment of the present invention.

FIG. 6 is a graph indicating waveforms of: (1) the voltage of the light-source-driving command signal S1; (2) the voltage of the heater-driving command signal S2; (3) the current supplied from the light-source driving circuit 52 to each of the GaN-based semiconductor laser chips LD1 through LD7 based on the light-source-driving command signal S1; (4) the current supplied from the heater driving circuit 53 to the heater 50 based on the heater-driving command signal S2; and (5) the sum of the currents (3) and (4).

The above high-luminance ultraviolet-light optically-multiplexing fiber module is used, for example, as a light source in an image exposure apparatus. In this case, the GaN-based semiconductor laser chips LD1 through LD7 are intermittently driven, as illustrated by (1) and (3) of FIG. 6.

For example, the GaN-based semiconductor laser chips LD1 through LD7 are driven for 15 seconds for image exposure, and stopped for 10 seconds for replacement of an exposed photosensitive material with a new photosensitive material.

On the other hand, as illustrated by (1) and (2) of FIG. 6, the heater 50 is driven so as to be energized when the GaN-based semiconductor laser chips LD1 through LD7 are at rest, and not to be energized when the GaN-based semiconductor laser chips LD1 through LD7 are in operation. When the heater 50 is energized, the heater 50 generates heat at a first heat-generation rate per unit time which is approximately identical to a second heat-generation rate per unit time at which the GaN-based semiconductor laser chips LD1 through LD7 generate heat when the GaN-based semiconductor laser chips LD1 through LD7 are in operation. Therefore, it is possible to maintain the temperature of the GaN-based semiconductor laser chips LD1 through LD7 almost unchanged. That is, the temperature rise after startup of the GaN-based semiconductor laser chips LD1 through LD7 can be suppressed. Thus, it is possible to suppress variations in the optical outputs of the GaN-based semiconductor laser chips LD1 through LD7, and stabilize the optical outputs of the GaN-based semiconductor laser chips LD1 through LD7 immediately after (e.g., within one second of) startup of the GaN-based semiconductor laser chips LD1 through LD7.

Since, in the construction of the first embodiment, a delay in response occurs in the heater 50 due to self-inductance, the current flowing through the heater 50 has a waveform as illustrated by (4) of FIG. 6. Therefore, the sum of the currents supplied to the GaN-based semiconductor laser chips LD1 through LD7 and the heater 50, which is indicated by (5) of FIG. 6, temporarily becomes great immediately after startup of the GaN-based semiconductor laser chips LD1 through LD7, as indicated by the circled portion denoted by reference letter A in (5) of FIG. 6. Thus, the delay in response raises the temperature of the GaN-based semiconductor laser chips LD1 through LD7 above a target value.

Operations of Second Embodiment

Figure 7:
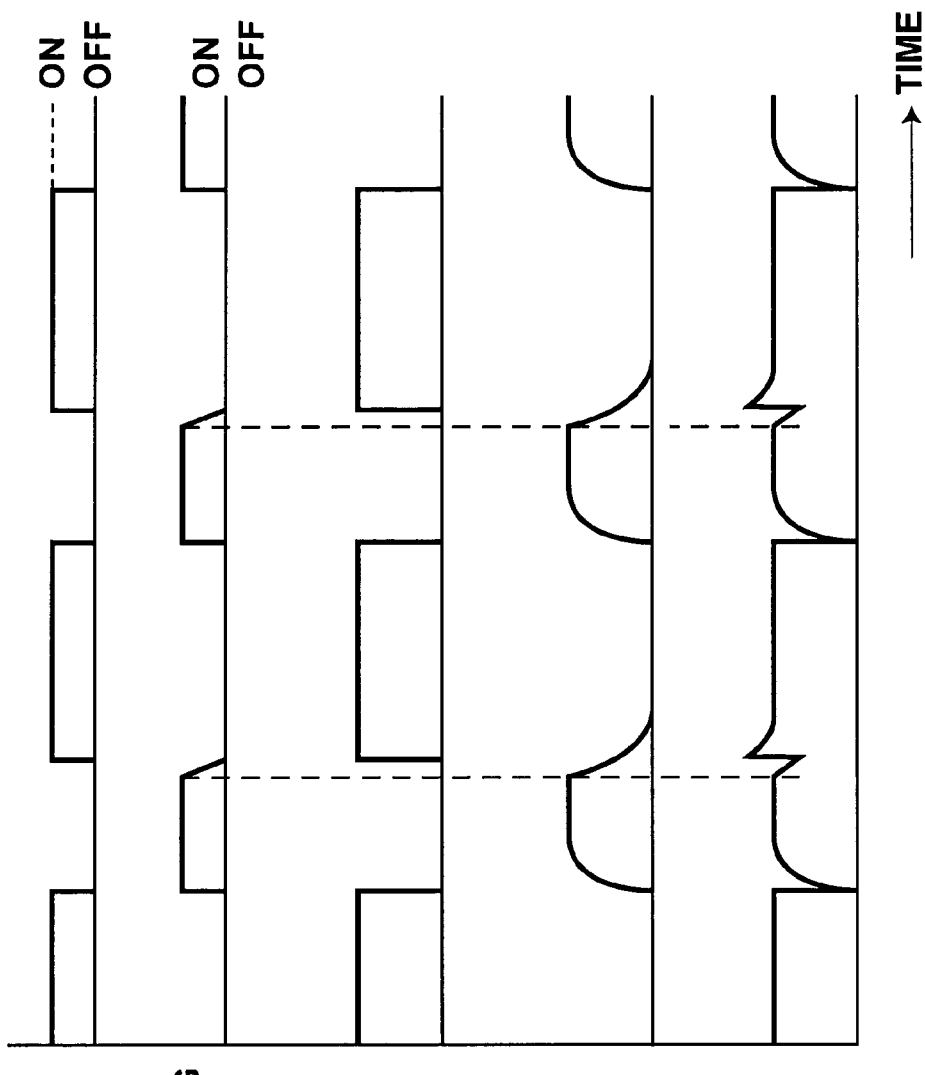
FIG. 7 is a graph indicating waveforms of driving signals and currents of semiconductor lasers and a heater in a second embodiment of the present invention.

The second embodiment of the present invention is provided for solving the above problem caused by the delay in response in the heater 50. FIG. 7 is a graph indicating waveforms of driving signals (voltages) and currents of semiconductor lasers and the heater in the second embodiment of the present invention. The voltages and currents indicated in FIG. 7, (1) through (5), correspond to the voltages and currents indicated in FIG. 6, (1) through (5), respectively. The construction of the second embodiment is identical to the construction of the first embodiment except that the heater-driving command signal S2 outputted from the control circuit 54 in the second embodiment has a waveform as illustrated by (2) of FIG. 7.

When the heater-driving command signal S2 as above is supplied to the heater driving circuit 53, the current flowing through the heater 50 has a waveform as illustrated by (4) of FIG. 7. Therefore, variations in the sum of the currents supplied to the GaN-based semiconductor laser chips LD1 through LD7 and the heater 50 immediately after startup are more effectively suppressed in comparison with the first embodiment illustrated in FIG. 6. Thus, it is possible to prevent rise of the temperature of the GaN-based semiconductor laser chips LD1 through LD7 above a target level, which is caused by the delay in response in the heater 50.

As understood from FIGS. 6 and 7, the driving currents of the GaN-based semiconductor laser chips LD1 through LD7 follow the light-source-driving command signal S1 responsively, and therefore the heat generation characteristics also follow the light-source-driving command signal S1 responsively. Therefore, when a GaN-based semiconductor laser or another type of semiconductor laser, instead of the heater 50, is used as a heater, it is possible to overcome the above problem caused by the delay in response.

Additional Matters (i) Although, in the first and second embodiments, the present invention is applied to a construction comprising a plurality of GaN-based semiconductor laser chips, the present invention can also be applied to any other types of semiconductor lasers. For example, the present invention can also be applied to a system in which only a single semiconductor laser is driven. In such cases, it is also possible to achieve the aforementioned effect of stabilizing the optical output. However, as mentioned before, the present invention is particularly effective in the case where a GaN-based semiconductor laser, a plurality of semiconductor lasers, or a multicavity semiconductor laser having a plurality of light-emission points is used.

(ii) Although, in the first and second embodiments, the heating is stopped by stopping the current supply to the heater almost simultaneously with startup of the semiconductor lasers, alternatively, it is possible to decrease the amount of heat supplied to the semiconductor lasers by limiting the current supplied to the heater to a very small amount, and lowering the temperature of the heater, simultaneously with startup of the semiconductor lasers.

(iii) In addition, all of the contents of the Japanese patent application No. 2002-287633 are incorporated into this specification by reference.

What is claimed is:

1. A method for stabilizing an optical output of a semiconductor laser, comprising the steps of:
   (a) heating the semiconductor laser with a heater when the semiconductor laser is not in operation; and
   (b) performing one of a first operation of stopping heating of the semiconductor laser and a second operation of decreasing an amount of heat supplied to the semiconductor laser, almost simultaneously with startup of the semiconductor laser.

2. A method according to claim 1, wherein said heater heats a vicinity of the semiconductor laser at a heating rate which approximately corresponds to a heat-generation rate at which the semiconductor laser generates heat when the semiconductor laser is in operation, and said first operation is performed almost simultaneously with startup of the semiconductor laser.

3. A method according to claim 1, wherein a current lower than an oscillation threshold level of the semiconductor laser is supplied to the semiconductor laser when the semiconductor laser is not in operation.

4. A method according to claim 2, wherein a current lower than an oscillation threshold level of the semiconductor laser is supplied to the semiconductor laser when the semiconductor laser is not in operation.

5. A method according to claim 1, wherein said semiconductor laser is realized by a GaN-based compound semiconductor laser, a multicavity semiconductor laser having a plurality of light-emission points, or a plurality of semiconductor lasers mounted on a common block.

6. A method according to claim 2, wherein said semiconductor laser is realized by a GaN-based compound semiconductor laser, a multicavity semiconductor laser having a plurality of light-emission points, or a plurality of semiconductor lasers mounted on a common block.

7. A method according to claim 3, wherein said semiconductor laser is realized by a GaN-based compound semiconductor laser, a multicavity semiconductor laser having a plurality of light-emission points, or a plurality of semiconductor lasers mounted on a common block.

8. A method according to claim 4, wherein said semiconductor laser is realized by a GaN-based compound semiconductor laser, a multicavity semiconductor laser having a plurality of light-emission points, or a plurality of semiconductor lasers mounted on a common block.

9. A method according to claim 1, wherein said heater is realized by a semiconductor laser chip.

10. A method according to claim 2, wherein said heater is realized by a semiconductor laser chip.

11. A method according to claim 3, wherein said heater is realized by a semiconductor laser chip.

12. A method according to claim 4, wherein said heater is realized by a semiconductor laser chip.

13. A method according to claim 1, wherein said heater comprises a heating wire or a heating resistor.

14. A method according to claim 2, wherein said heater comprises a heating wire or a heating resistor.

15. A method according to claim 3, wherein said heater comprises a heating wire or a heating resistor.

16. A method according to claim 4, wherein said heater comprises a heating wire or a heating resistor.

17. A method according to claim 1, wherein said first operation of stopping the heating of the semiconductor laser is accomplished by eliminating a voltage applied to the heater.

18. A method according to claim 17, wherein the voltage applied to the heater is applied incrementally to alternate with application of a voltage to the laser.

* * * * *